(12) United States Patent
Kaufman et al.

(10) Patent No.: US 6,208,202 B1
(45) Date of Patent: Mar. 27, 2001

(54) HIGH EFFICIENCY SWITCHED GAIN POWER AMPLIFIER

(75) Inventors: Ralph E. Kaufman, La Mesa; Darin Hunzeker; Richard J. Camarillo, both of San Diego, all of CA (US)

(73) Assignee: Qualcomm, Inc, San Diego, CA (US)

( * ) Notice: Subject to any disclaimer, the term of this patent is extended or adjusted under 35 U.S.C. 154(b) by 0 days.

(21) Appl. No.: 09/248,048

(22) Filed: Feb. 10, 1999

Related U.S. Application Data

(63) Continuation-in-part of application No. 09/158,456, filed on Sep. 22, 1998.

(51) Int. Cl.⁷ .................................................... H03F 1/14
(52) U.S. Cl. ............................................. 330/51; 330/151
(58) Field of Search ................................ 330/51, 53, 157, 330/306

(56) References Cited

U.S. PATENT DOCUMENTS

| | | | |
|---|---|---|---|
| 5,423,074 | 6/1995 | Dent | 455/74 |
| 5,661,434 | 8/1997 | Brozovich et al. | 330/51 |
| 5,673,003 * | 9/1997 | Zocher | 330/306 |
| 5,793,253 * | 8/1998 | Kumar et al. | 330/51 |
| 5,872,481 * | 2/1999 | Sevic et al. | 330/51 |
| 5,909,643 * | 6/1999 | Aihara | 330/51 |
| 5,973,557 * | 10/1999 | Miyaji et al. | 330/51 |

* cited by examiner

*Primary Examiner*—Robert Pascal
*Assistant Examiner*—Khanh Van Nguyen
(74) *Attorney, Agent, or Firm*—Philip Wadsworth; Charles D. Brown

(57) ABSTRACT

A power amplifier circuit arrangement including a driver amplifier, a switch, an amplifier path having a band pass filter and a power amplifier, and a bypass path which bypasses the power amplifier when excess gain and output power are not needed. When an RF-analog signal from the driver amplifier is switched to the amplifier path, the signal is band-pass filtered and amplified. Then the signal is split into an in-phase and a quadrature signal. Either the in-phase or the quadrature signal is inverted and summed with the other of the in-phase or quadrature signal, and the summed signal is transmitted to an output port. When the RF-signal from the driver amplified is switched to the bypass path, the power amplifier is turned off and the bypass path directs the signal to the output of the power amplifier, which appears as a high impedance to the signal. The signal reflects off the power amplifier to the output port. This design preserves the benefits of bypassing the power amplifier by reducing the amount of switching loss introduced into the circuit.

33 Claims, 8 Drawing Sheets

HIGH EFFICIENCY SWITCHED GAIN POWER AMPLIFIER

This application is a Continuation In Part Application of co-pending U.S. patent application Ser. No. 09/158,456 entitled "High Efficiency Switched Gain Power Amplifier", filed on Sep. 22, 1998 and assigned to the Assignee of the present invention.

BACKGROUND INFORMATION

I. Field of the Invention

The present invention relates generally to power gain control for a power amplifier circuit and particularly to a power application circuit having greater power conservation in wireless communication device, such as a CDMA wireless phone.

2. Description of the Related Art

In many electronic environments, such as most hand-held communication systems including code-division-multiple-access (CDMA) or any form of time-division-multiple access (TDMA) technology, RF power output from a mobile unit varies in large dynamic ranges. In a CDMA radiotelephone system, multiple signals are transmitted simultaneously at the same frequency. The signals are spread with different digital codes, thus allowing detection of the desired signal while the unintended signals appear as noise or interference to the receiver. Spread spectrum systems can tolerate some interference, and the interference added by each new mobile station increases the overall interference in each cell site. Each mobile station introduces a unique level of interference, which depends on its received power level at the cell site.

The CDMA system uses power control to minimize mutual interference. A precise power control is critical to avoid excessive transmitter signal power that is responsible for contributing to the overall interference of the system. Power of the individual mobile stations varies with the distance between the mobile station and the base station and the number of other subscriber mobile stations in that base station or sector.

In a typical hand-held wireless unit, the power amplifier is biased class AB to reduce power consumption during periods of low transmit power, but power continues to be consumed. Typically an isolator is used to isolate the power amplifier from the effects of load impedance in subsequent stages. One method to avoid continuous battery draw is to employ a means to bypass the amplifier with switches, and then remove DC power from the amplifier. Such a power amplifier circuit has a power amplifier and an isolator. An RF-input is connected to a pole of a first switch. When the amplifier is on, the switch connects the RF-input to an input of the power amplifier. The RF-signal is amplified and output to the isolator, and then transmitted through the second switch to the RF-output of the power amplifier circuit. To bypass the power amplifier, the first switch connects the RF-input to the bypass path and the second switch transmits the signal to the RF-output. The switching employed introduces loss as the signal is processed. The drawback of this design is that the amplifier must overcome the added switching loss during times that higher transmit power is required. This can tend to cancel the benefits of bypassing.

SUMMARY OF THE INVENTION

What is needed in the art is a cellular phone or mobile station having power amplifier circuit which conserves power by turning off and bypassing the power amplifier when power demand is low and by using a driver amplifier ("DA") as the power output amplifier.

An object of the present invention is to increase the efficiency of power amplifier usage by providing a circuit to bypass the power amplifier or power amplifiers when power demand is low.

Another object of the present invention is to reduce the effects of power loss after a signal is amplified by a power amplifier.

Another object of the present invention is to provide an improved power amplifier which requires less parts and is less complex to build.

Yet another object of the present invention is to provide an improved power amplifier which is less expensive to build.

These objects and others may be realized by the invention disclosed herein. In a mobile station having a power amplifier circuit, a switch operates to direct the received signal from a driver amplifier to either an amplifier path containing a band-pass filter and a power amplifier, or a bypass path. The bypass path bypasses the power amplifier when the power amplifier capability is not required. During the periods of low power operation, the amplifier is turned off. When the signal is passed through the bypass path it enters the isolated port of a hybrid circuit. The signal is transmitted to the output of the power amplifier. The power amplifier appears as a large impedance which is highly reflective because it is turned off. The reflected signal is then routed to the output port or front end of the circuit. With this configuration, an output switch becomes unnecessary and the power loss after the signal is amplified is reduced.

A first band-pass filter is placed in the amplification path such that filtering is also bypassed when the power amplifier is bypassed. When greater power amplification of the signal is needed, the signal flow is directed through a transmitter chain containing the first band-pass filter and a power amplifier ("PA"). The first filter in the transmitter chain cleans up noise added by the DA. The PA amplifies the signal which then is transmitted through an isolator and a second filter at the output of the circuit which cleans up noise added by the PA. A benefit of bypassing the PA is that it no longer adds noise to the signal. The second filter at the output of the circuit still filters the added effects of the PA, and when the signal routes through the bypass path, the second filter reduces noise added by the driver amplifier. Therefore, the first filter becomes unnecessary when the signal is passed through the bypass path.

This power amplification circuit provides reduced loss at the end of the amplifier, whereby greater power using less current at the output may be achieved. The configuration also reduces the loss in the bypass path when changing modes from amplification to bypass. The driver amplifier therefore becomes the output amplifier.

In another aspect of the present invention, bypassing the power amplifier enables the driver amplifier to be driven harder because it is the dominating source of distortion in the chain. The driver amplifier may be driven to a greater degree in the non-linear region than could be accomplished when using the power amplifier. By expanding the region over which the driver amplifier is driven, the cellular phone may be operated using the driver amplifier for a longer period of time, thus conserving battery power by keeping the power amplifier off for longer periods of time.

BRIEF DESCRIPTION OF THE DRAWINGS

The features and advantages of the present invention will become more apparent from the detailed description set

Figure 1:
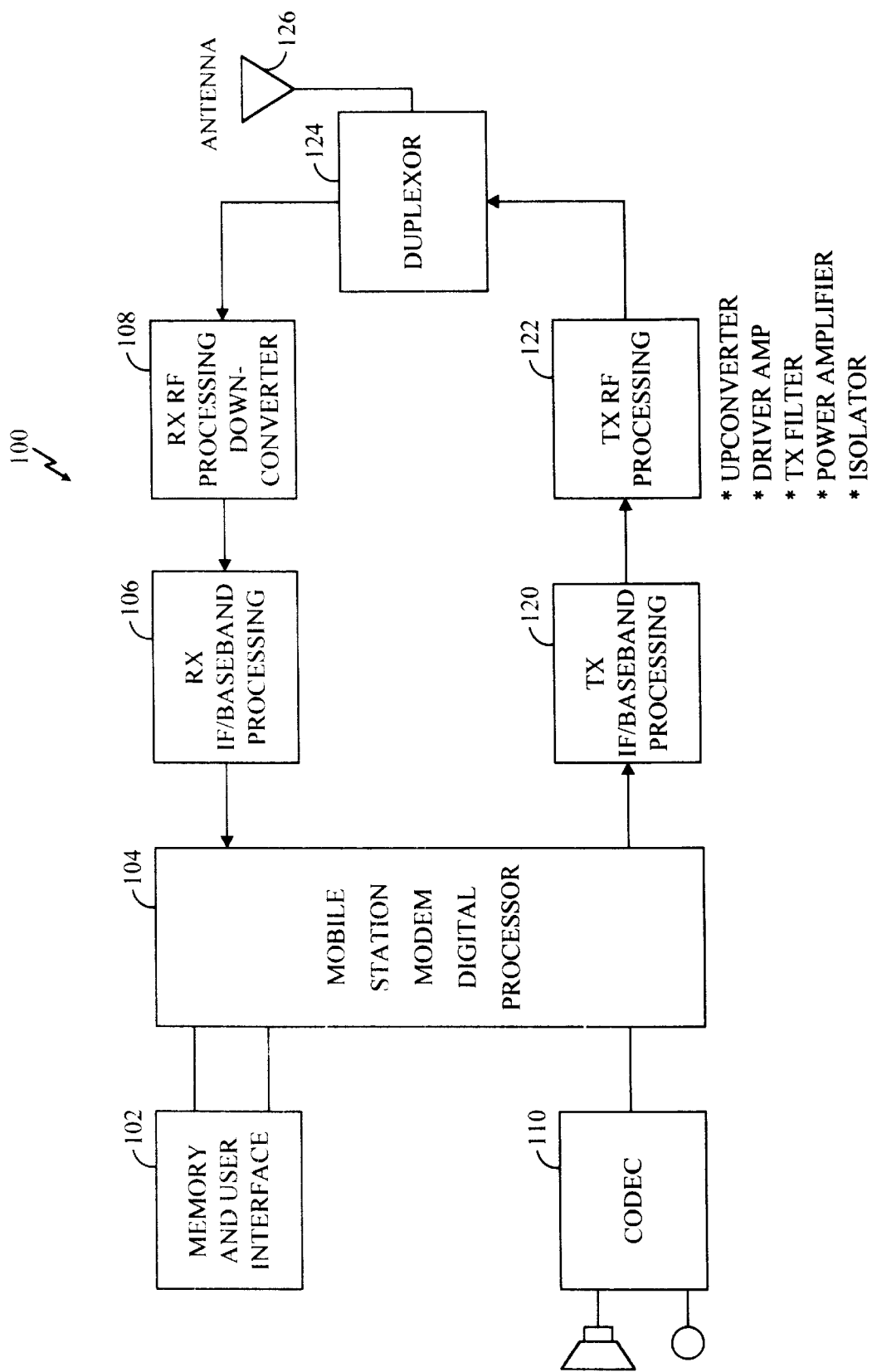
Figure 2:
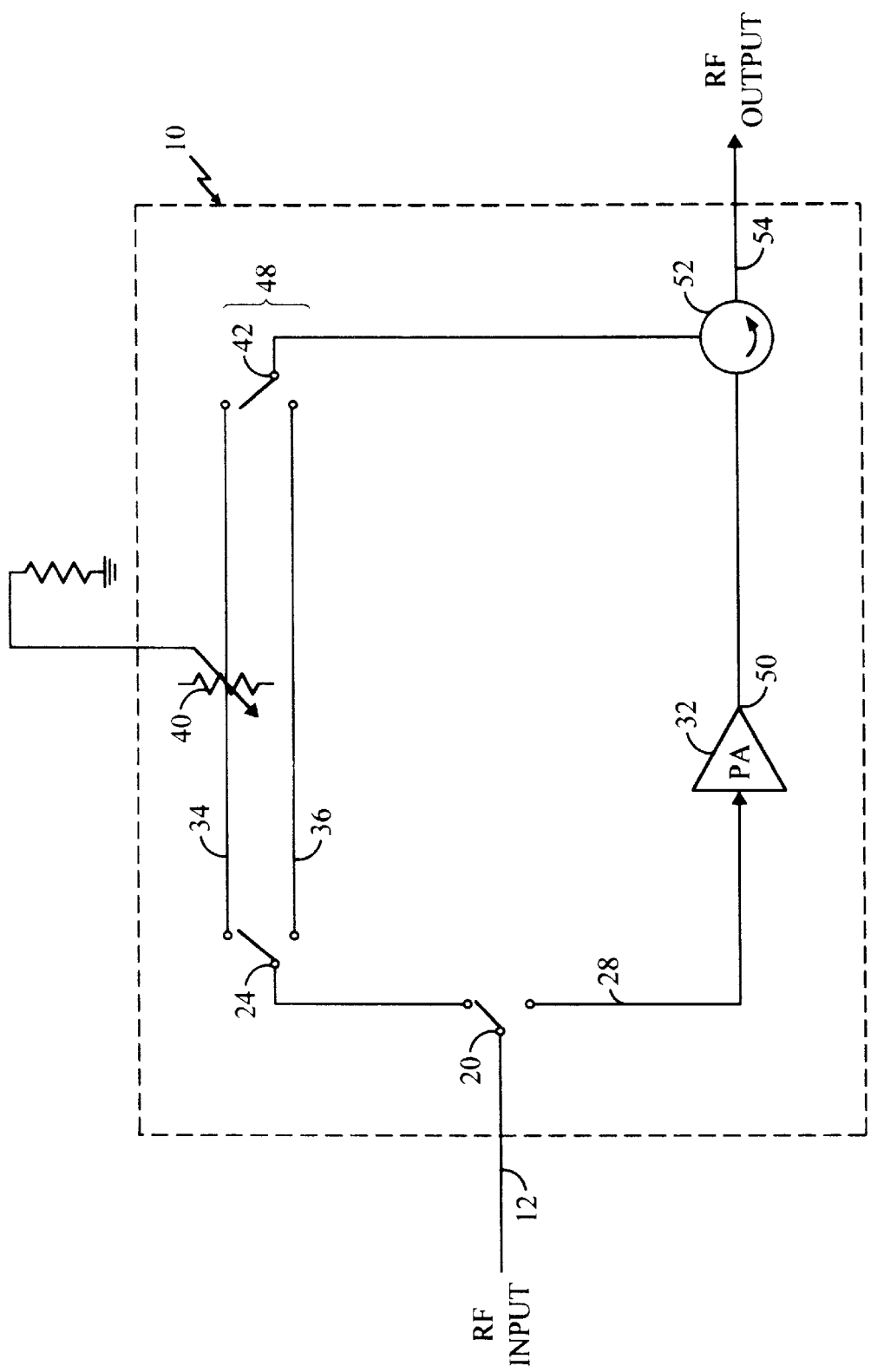
Figure 3:
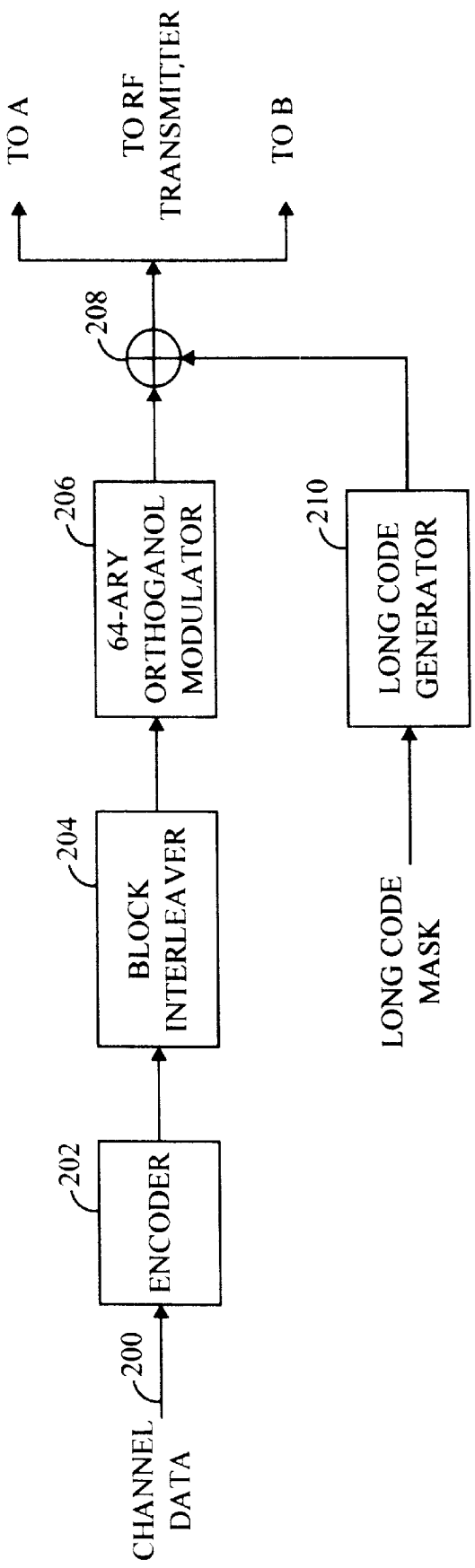
Figure 4:
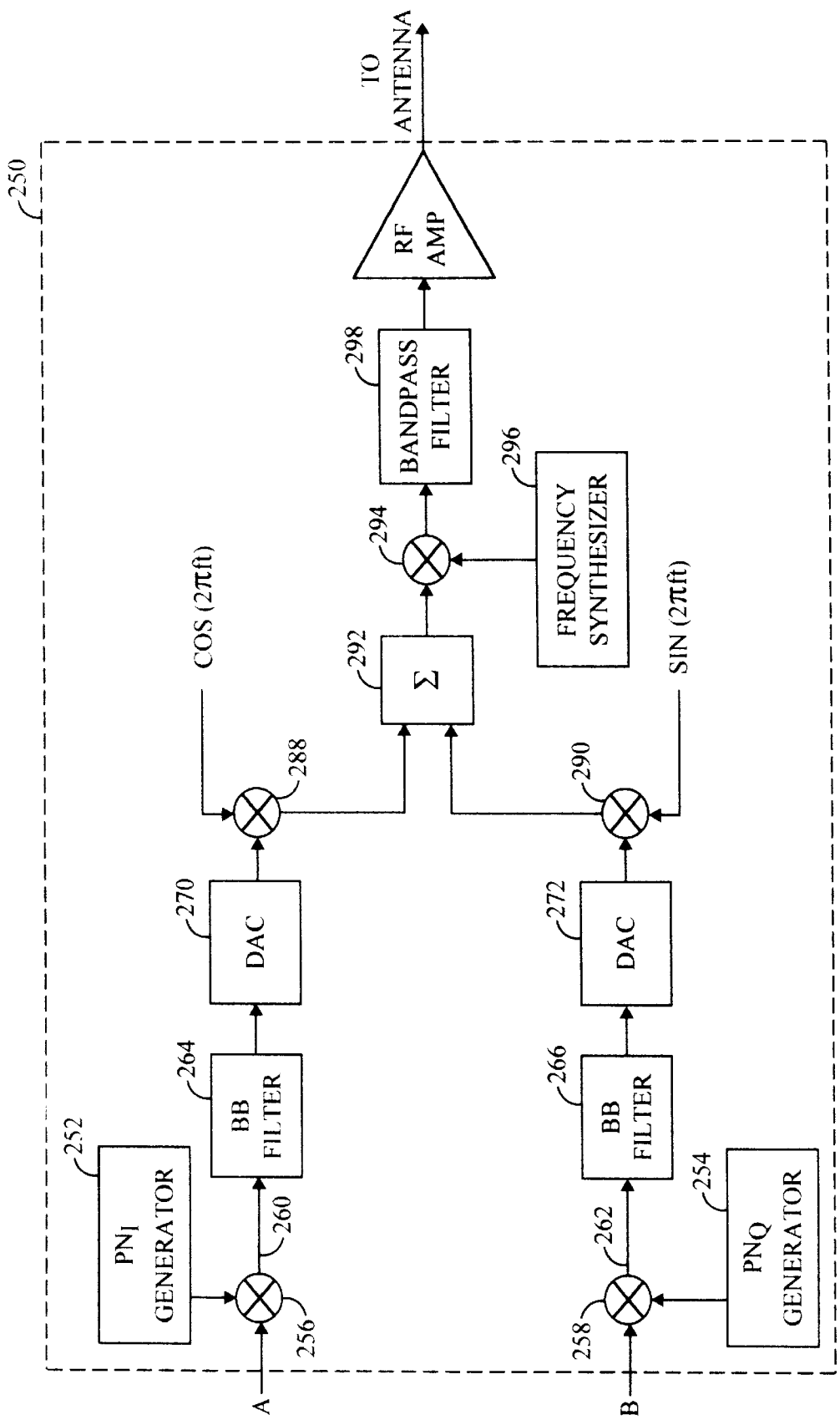
Figure 5:
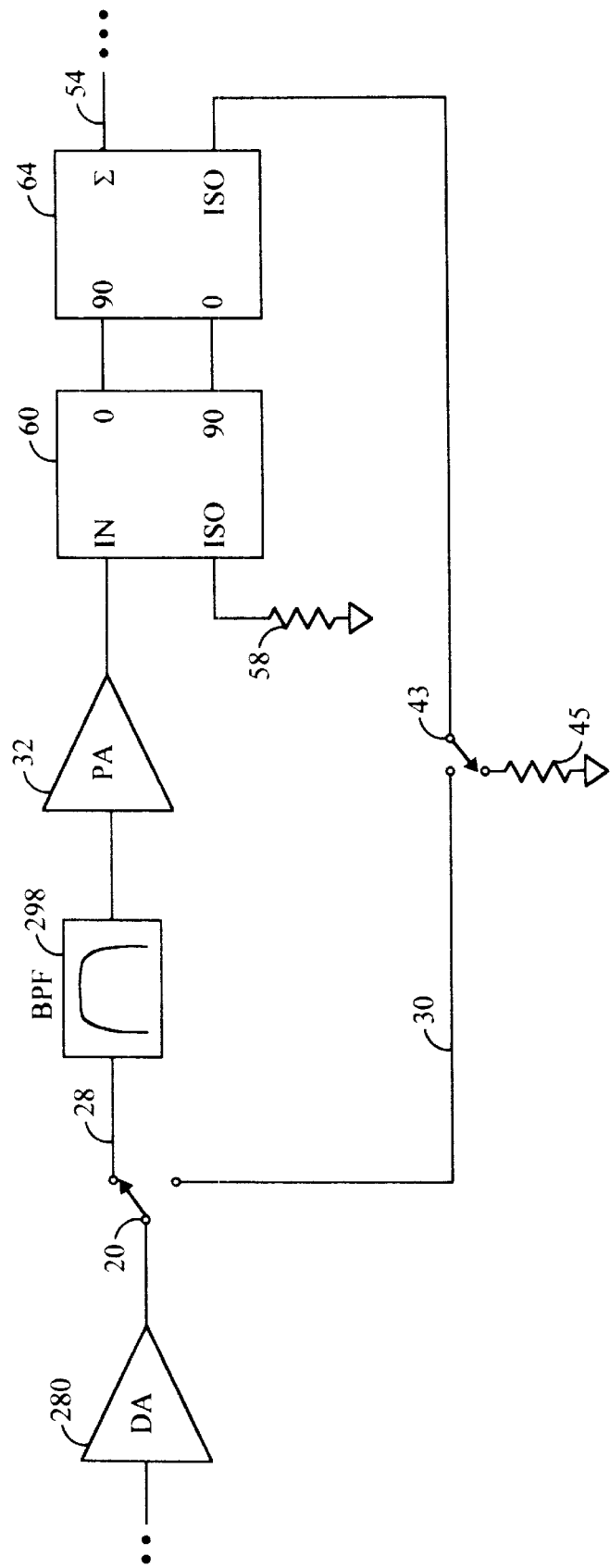
Figure 6:
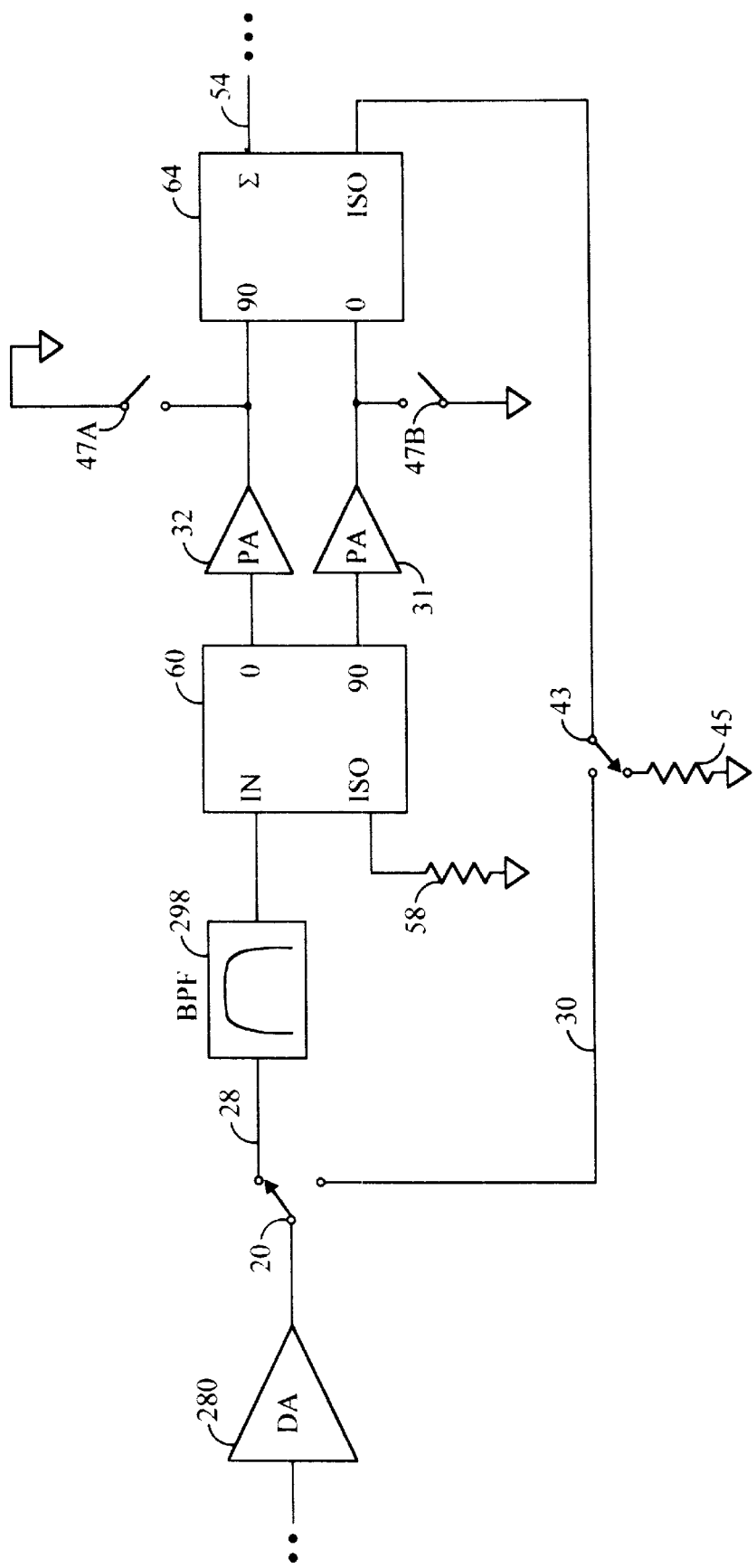
Figure 7:
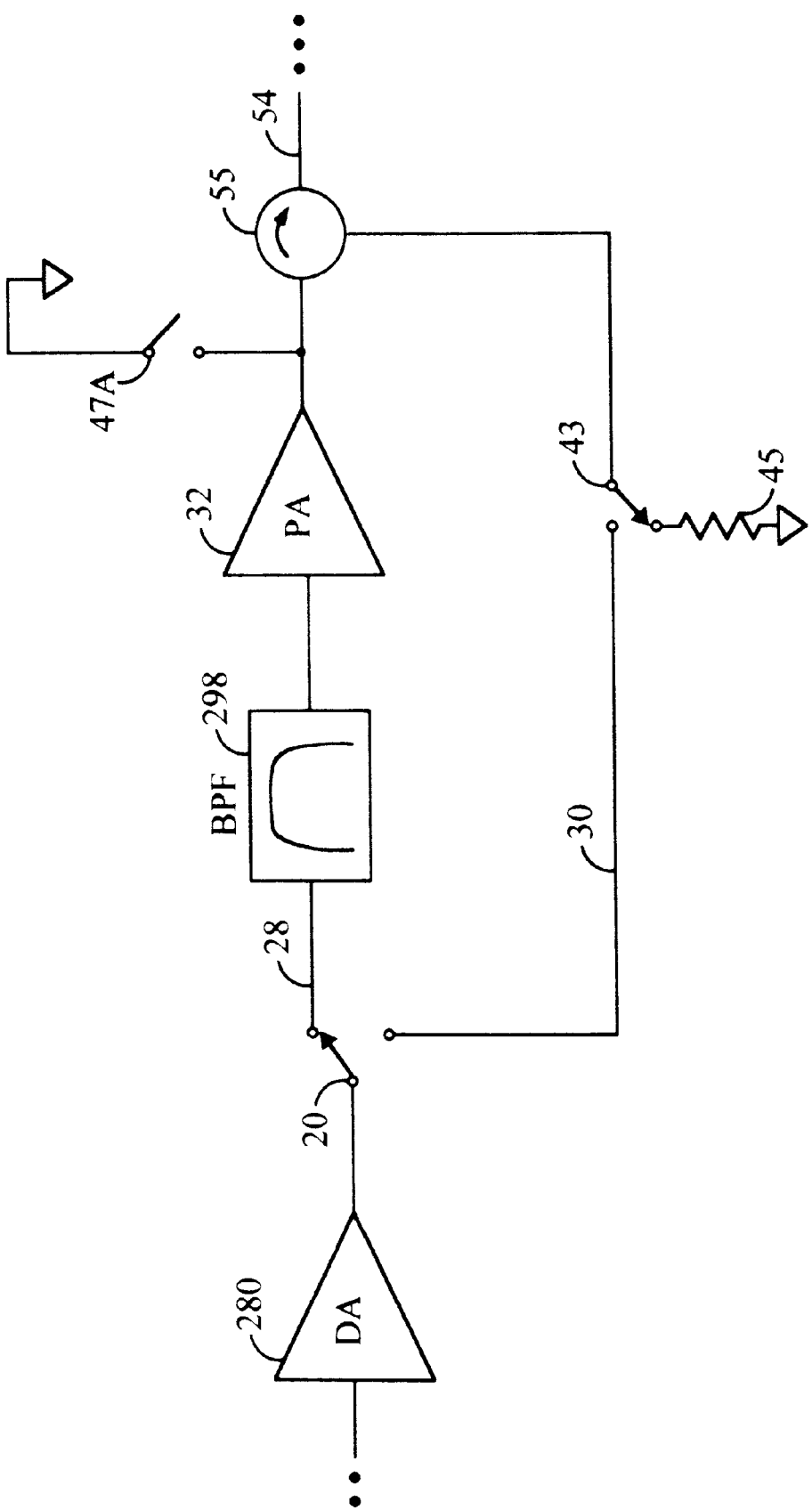

3 forth below when taken in conjunction with the drawings in which like reference characters correspond throughout and wherein:

FIG. 1 is a block diagram of a mobile station of the present invention;

FIG. 2 is a plan drawing of the first embodiment of the present invention;

FIG. 3 provides a block diagrammatic representation of a mobile station spread spectrum transmitter in which may be incorporated an efficient power amplifier of the present invention;

FIG. 4 shows an exemplary implementation of an RF transmitter included within the spread spectrum transmitter of FIG. 2;

FIG. 5 is a plan drawing of the second embodiment of the present invention;

FIG. 6 is a plan drawing of the third embodiment of the present invention;

FIG. 7 is a plan drawing of the fourth embodiment of the present invention; and

Figure 8:
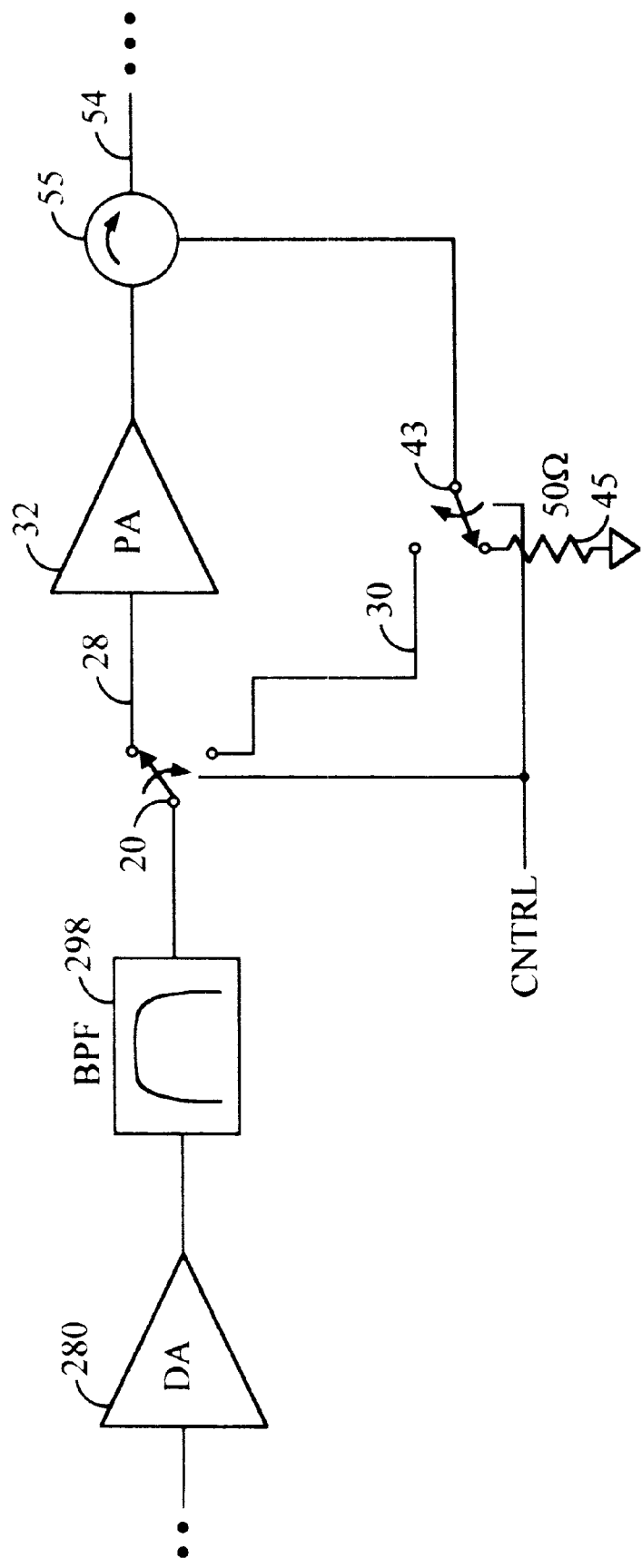

FIG. 8 is a plan drawing of a sixth embodiment of the present invention.

DETAILED DESCRIPTION OF THE INVENTION

FIG. 1 illustrates a mobile station of the present invention and its signal processing. A mobile station 100 comprises circuitry for interfacing with system memory and the user 102. The memory and user interface 102 is connected to a digital processor 104 which controls the signal processing. A receiving chain comprises a receiving IF/baseband signal processing circuit 106 connected to the digital processor 104, and a receiving RF-signal processing circuit 108. A transmitting chain comprising a transmitting IF/baseband processing circuit 120 is connected to the digital processor 104. A transmitting RF processing circuit 122 includes the power amplifier circuit arrangement described in more detail herein.

A duplexer 124 controls the signal flow from the receiving chain and the transmitting chain and an antenna 126. A codec circuit 110 is connected to the digital processor 104. The circuit elements illustrated in FIG. 1, except the transmitting signal processing 122 disclosed herein, are generally known to those of ordinary skill in the art. Accordingly, the foregoing description and block diagram of FIG. 1, in addition to the disclosure of the power amplifier circuit arrangement of the present invention, sufficiently enable one of ordinary skill in the art to make and use the mobile station of the present invention.

FIG. 2 is a schematic diagram showing the power amplifier aspect of the invention. A power amplifier circuit, indicated generally by reference numeral 10, comprises a power amplifier 32, a circulator 52, a series of switches, 20, 24 and 42, and bypass paths 34 and 36 around the power amplifier 32. An RF-input 12 having an RF-signal to be amplified is connected to a pole of first switch 20. When amplification of the RF-signal is required, the power amplifier 32 is turned on and the switch 20 connects the RF-input 12, via a path 28, to an input of the power amplifier 32. The power amplifier transmits the RF-signal toward the circulator 52. The circulator 52 routes the signal to a port of the RF-output 54.

When power demand is low and the power amplifier is turned off, the switch 20 switches the RF-signal to a bypass network 48 comprising a bypass path 36 and an attenuated

4 path 34. To send the signal through the bypass path 36, switches 24 and 42 switch to a first position such that the signal flows through bypass path 36. Switches 24 and 42 can also switch the signal to flow through the attenuated path 34. From switch 42 the signal is transmitted to an input of circulator 52. The circulator 52 routes the signal to the port connected to the output 50 of the power amplifier 32. The output of the power amplifier 50 appears as a high impedance to the signal and thus the signal is reflected back to the circulator 52, which routes the signal to the port of the RF-output 54 of amplifier circuit 10.

FIG. 3 is a schematic diagram illustrating the use of the power amplifier of the present invention in the signal processing circuitry of a mobile station. In an exemplary CDMA system, orthogonal signaling is employed to provide a suitable ratio of signal-to-noise on the mobile-station to base-station link, or the "reverse" channel. Data bits 200 consisting of, for example, voice converted to data by a vocoder, are supplied to an encoder 202 where the bits are convolutionally encoded. When the data bit rate is less than the bit processing rate of the encoder 202, code symbol repetition may be used such that the encoder 202 repeats the input data bits 200 in order to create a repetitive data stream at a bit rate which matches the operative rate of the encoder 202. In an exemplary embodiment the encoder 202 receives data bits 200 at a nominal bit rate ($R_b$) of 11.6 kbits/second, and produced $R_b/r$=34.8 symbols/second, where "r" denotes the code rate (e.g. ⅓) of the encoder 202. The encoded data is then provided to a block interleaver 204.

With the 64-ary orthogonal modulator 206, the symbols are grouped into characters containing $\log_2 64$=6 symbols at a rate of $(1/r)(R_b/\log_2 64)$=5,800 characters/second, with there being 64 possible characters. In a preferred embodiment each character is encoded into a Walsh sequence of length 64. That is, each Walsh sequence includes 64 binary bits or "chips", there being a set of 64 Walsh codes of length 64. The 64 orthogonal codes correspond to Walsh codes from a 64 by 64 Hadamard matrix wherein a Walsh code is a single row or column of the matrix.

The Walsh sequence produced by the modulator 206 is provided to an exclusive-OR combiner 208, where it is then "covered" or multiplied at a combiner with a PN code specific to a particular mobile station. Such a "long" PN code is generated at a rate $R_c$ by a PN long code generator 210 in accordance with a user PN long code mask. In an exemplary embodiment the long code generator 210 operates at an exemplary chip rate, $R_c$, of 1.2288 Mhz so as to produce four PN chips per Walsh chip. The output of the exclusive-OR combiner 208 is split into identical signals A and B. Signals A and B are input into the exclusive-OR combiners 256 and 254 of FIG. 4 as described below.

FIG. 4 is a schematic diagram showing an exemplary implementation of the RF transmitter 250 in a mobile station. In CDMA spread spectrum applications, a pair of short PN sequences, $PN_I$ and $PN_Q$, are respectively provided by a $PN_I$ generator 252 and a $PN_Q$ generator 254 to exclusive-OR combiners 256 and 258, along with the output A and B from exclusive-OR combiner 208 of FIG. 2. The $PN_I$ and $PN_Q$ sequences relate respectively to in-phase (I) and quadrature phase (Q) communication channels, and are generally of a length (32,768 chips) much shorter than the length of each user long PN code. The resulting I-channel code spread sequence 260 and Q-channel code spread sequence 262 are then passed through baseband filters 264 and 266, respectively.

Digital to Analog (D/A) converters 270 and 272 are provided for converting the digital I-channel and Q-channel information, respectively, into analog form. The analog waveforms produced by D/A converters 270 and 272 are provided with a local oscillator (LO) carrier frequency signals Cos (2πft) and Sin (2πft), respectively, to mixers 288 and 290 where they are mixed and provided to summer 292. The quadrature phase carrier signals Sin (2πft) and Cos (2πft) are provided from suitable frequency sources (not shown). These mixed IF signals are summed in summer 292 and provided to mixer 294.

Mixer 294 mixes the summed signal with an RF frequency from frequency synthesizer 296 so as to provide frequency upconversion to the RF frequency band. The RF may then be bandpass filtered 298 and provided to an efficient parallel stage RF amplifier 10 of the invention. The filter 298 removes undesired spurs caused from upconversion 296. Another filter (not shown) may be located following the amplifier circuitry to remove undesired spurs when the circuit is operating in bypass mode. In a bypass mode, the previous driver amplifier becomes the output amplifier and filtering may be necessary to prevent extra spurs from mixing in the non-linearities of the amplifier. This filtering may be accomplished by another filter (not shown), thus the band-pass filter 298 may be located in the amplification path as illustrated in FIGS. 5, 6 and 7 discussed below. This also increases flexibility in choosing gain steps.

FIG. 5 illustrates a second embodiment of the invention wherein the power loss after the power amplifier is minimized. A driver amplifier 280 produces an analog signal, which is switched by a first switch 20 between an amplifier path 28 and a bypass path 30. In the amplifier path 28, the signal is band-pass filtered 298 and amplified by a power amplifier 32. The amplified signal is split by a first hybrid circuit 60 to produce an in-phase signal and a quadrature signal ninety degrees out of phase. Either of the in-phase signal or quadrature signal is inverted by a coupler or a second hybrid circuit 64 to produced an inverted signal according to means known by those of ordinary skill in the art. The inverted signal and the un-inverted signal, i.e. the other of the in-phase or quadrature signal, are summed by a summing feature of the second hybrid circuit 64 and transmitted toward the RF-output port 54 or antenna (not shown). Prior to being transmitted from an antenna, the signal is again filtered by a filter (not shown) to reduce any unwanted spurs or other effects.

When the first switch 20 routes the signal to the bypass path 30, the signal is transmitted to an isolated port of the second hybrid circuit 64. The second hybrid circuit 64 splits the signal into an in-phase signal and a quadrature signal ninety degrees out of phase. The first hybrid circuit 60 inverts either the in-phase signal or the quadrature signal and sums the two signals. The summed signal is transmitted to the output of the power amplifier 32. The power amplifier 32 in this scenario is turned off to conserve power.

The turned-off power amplifier appears as a large impedance or a reflective load to the signal, which therefore reflects back to the first hybrid circuit 60. The reflected signal is split by the first hybrid circuit 60 into an in-phase signal and a quadrature signal ninety degrees out of phase, input into the second hybrid circuit 64, where one of either the in-phase or quadrature signal is inverted. The inverted signal is summed with the other un-inverted signal, filtered, and transmitted to the output port 54 or antenna.

When the bypass path is used, a second switch 43 positioned in the bypass path selectively connects the isolated port of the second hybrid circuit 64 with the first switch 20. However, when the amplifier path 28 is utilized, the second switch 43 selectively connects the isolated port of the second hybrid circuit 64 to route reflected signals to a terminating resistor 45. When the power amplifier 32 is bypassed, the signal reflected off of the power amplifier 32 acting as a reflecting load is filtered by a filter (not shown) prior to being radiated by the antenna (not shown). The circuit of the present invention does not need an output switch after the power amplifier, which simplifies the circuit and reduces the power loss after the power amplifier 32.

FIG. 6 illustrates a third and preferred embodiment of the present invention which provides greater minimization of power loss after the amplifying the signal with power amplifiers. This embodiment provides a driver amplifier 280 producing an analog signal. The analog signal is switched by a first switch 20 between an amplifier path 28 and a bypass path 30. In the amplifier path, the signal is band-pass filtered 298, split by a first hybrid circuit 60 into an in-phase signal and a quadrature signal ninety degrees out of phase. The in-phase signal and the quadrature signal are each independently amplified by a first amplifier 31 and a second amplifier 32, respectively. One of the amplified in-phase signal or the amplified quadrature signal is inverted by the second hybrid circuit 64 to produce an inverted signal. The inverted signal and the other un-inverted signal are summed in the second hybrid circuit 64, filtered by a filter (not shown) and fed toward the RF-output port 54 or antenna (not shown).

The bypass path 30 provides a path from the first switch 20 to an isolated port of the second hybrid circuit 64. The signal is split into an in-phase signal and a quadrature signal the hybrid circuit 64. The in-phase signal is transmitted to the output of the first power amplifier 31 which is turned off and therefore appears as a reflective load to the signal. The quadrature signal is transmitted to the output of the second power amplifier 32, which is turned off and therefore appears as a reflective load to the signal. Each reflected signal again enters the second hybrid circuit 64, where either the in-phase signal or the quadrature signal one of the split signals is inverted and summed with the other signal. The summed signal is output to the output port 54. Each circuit in FIGS. 5 and 6 also contains a filter (not shown) after the power amplifier or power amplifiers. Accordingly, a signal reflected from the high impedance output of the power amplifier is still band-pass filtered to reduce unwanted effects.

When the bypass path is used, a second switch 43 connects the isolated port of the hybrid circuit 64 with the first switch 20. However, when the amplifier path 28 is utilized, the switch 43 connects the isolated port of the second hybrid circuit 64 with ground through a resistor 45, which routes any reflected signal to ground. The circuit of this arrangement does not need an output switch and therefore simplifies the circuit and reduces the power consumption.

Shunt switches 47a, 47b can be used to shunt the output of the power amplifiers 31, 32 when using the bypass path 30. This will ensure that the output of each power amplifier 31, 32 is reflective without introducing significant loss. The shunt switches 47a, 47b could be implemented with a pin diode, FET switch or other means.

FIG. 7 is a fourth embodiment of the present invention wherein the analog signal is switched by a first switch 20 between a bypass path 30 and an amplifier path 28. However, band-pass filtering 298 only occurs in the amplifier path 28. Accordingly, the signal is band-pass filtered 298 and fed to the power amplifier 32, amplified, and transmitted to the circulator 55, which routes the signal towards the RF-output port. When the first switch 20 directs the analog signal through the amplifier path, the circulator 55 is connected to ground through a second switch 43 and a resistor 45. Accordingly, with this configuration, when reflected or returned RF-signals enter the circulator 55 from the direction of the RF-output port, the reflected signal is routed by the circulator 55 to ground. When the first switch 20 switches the analog signal to the bypass path 30, the second switch 43 connects the bypass path 30 to the circulator 55, and the signal is routed toward the output of the amplifier. This will appear as a high impedance, reflecting the signal back through isolator (shunt) 55 and to RF-output port 54.

As in FIG. 6, a shunt switch 47a may be used to shunt the output of power amplifier 32 when using the bypass path 30. This ensures that the output of PA 32 is reflective without introducing significant loss. The shunt 47a may be a PIN diode, FET switch or other means.

FIG. 8 illustrates another aspect of the power amplifier circuit of FIG. 2 without the attenuating path 34. An analog signal is fed from a driver amplifier 280 through a band pass filter 298 to a first switch 20. The switch 20 alternates between a bypass path 30 and an amplifier path 28, wherein a power amplifier 32 amplifies the signal. A second switch 42 transmits the analog signal from either the bypass path 30 or the amplifier path 28 to a circulator 55, which routes the signal to the RF-output port 54.

The previous description of the preferred embodiment are provided to enable any person skilled in the art to make or use the present invention. Various modifications to those embodiments will be readily apparent to those skilled in the art, and the generic principles defined herein may be applied to other embodiments without the use of the inventive faculty. Thus, the present invention is not intended to be limited to the embodiments shown herein, but is to be accorded the widest scope consistent with the principles and novel features disclosed herein.

We claim:

1. A power amplifier circuit arrangement, comprising:
   a driver amplifier for transmitting an analog signal;
   a first switch for selectively switching the analog signal between a bypass path and an amplifier path, said amplifier path comprising:
      a band-pass filter for filtering the analog signal and for producing a filtered signal;
      a power amplifier for receiving the filtered signal and for producing an amplified signal;
      a first hybrid circuit for splitting the amplified signal into an in-phase signal and a quadrature signal; and
      a second hybrid circuit for inverting the in-phase signal to produce an inverted signal and for summing the inverted signal and the quadrature signal to produce a summed signal,
   said bypass path connecting an output of said driver amplifier with an isolated port of said second hybrid circuit when said first switch switches the analog signal to said bypass path, whereby the analog signal transmitted from said driver amplifier will reflect off of said power amplifier and be routed to an output port.

2. The circuit arrangement of claim 1, further comprising:
   a second switch positioned in said bypass path; and
   a terminating resistor connected to a pole of said second switch,
   said second switch selectively connecting the isolated port of said second hybrid circuit with either said first switch or said terminating resistor.

3. The circuit arrangement of claim 1, wherein the analog signal is a radio-frequency analog signal.

4. The power amplifier circuit arrangement of claim 1, wherein said first switch switches the analog signal to said bypass path when said power amplifier is turned off.

5. A power amplifier circuit arrangement, comprising:
   a driver amplifier for transmitting an analog signal;
   a first switch for selectively switching the analog signal between a bypass path and an amplifier path, said amplifier path comprising:
      a band-pass filter for filtering the analog signal and for producing a filtered signal;
      a power amplifier for receiving the filtered signal and for producing an amplified signal;
      a first hybrid circuit for splitting the amplified signal into an in-phase signal and a quadrature signal; and
      a second hybrid circuit for inverting the quadrature signal to produce an inverted signal and for summing the inverted signal and the in-phase signal to produce a summed signal,
   said bypass path connecting an output of said driver amplifier with an isolated port of said second hybrid circuit when said first switch switches the analog signal to said bypass path, whereby the analog signal transmitted from said driver amplifier will reflect off of said power amplifier and be routed to an output port.

6. The circuit arrangement of claim 5, further comprising:
   a second switch positioned in said bypass path; and
   a terminating resistor connected to a pole of said second switch,
   said second switch selectively connecting the isolated port of said second hybrid circuit with either said first switch or said terminating resistor.

7. The circuit arrangement of claim 5, wherein the analog signal is a radio-frequency analog signal.

8. The power amplifier circuit arrangement of claim 5, wherein said first switch switches the analog signal to said bypass path when said power amplifier is turned off.

9. A method for amplifying a signal in a circuit having a driver amplifier, an amplifier path comprising a first switch, a band-pass filter, a power amplifier, a first hybrid circuit and a second hybrid circuit, and a bypass path connecting an isolated port of the second hybrid circuit to the first switch, said method comprising:

(A) producing a driver signal from the driver amplifier;
   (B) selectively switching the driver signal between the amplifier path and the bypass path using the first switch,
   wherein when the driver signal is switched in said switching step to the amplifier path, said method further comprises the steps of:
      (a) band-pass filtering the driver signal by the band-pass filter to produce a filtered signal;
      (b) amplifying the filtered signal by the power amplifier to produce an amplified signal;
      (c) splitting the amplified signal into an in-phase signal and a quadrature signal in the first hybrid circuit;
      (d) inverting the in-phase signal to produce an inverted signal in the second hybrid circuit; and
      (e) summing the inverted signal and the quadrature signal to produce a summed signal in the second hybrid circuit,
   and wherein when the driver signal is switched in said switching step to the bypass path, said method further comprises the steps of:
      (a) turning off the power amplifier;
      (b) transmitting the driver signal to the isolated port of the second hybrid circuit;

(c) reflecting the driver signal off an output of the power amplifier to an output port.

10. The method of claim 9, wherein the circuit further comprises a second switch positioned in the bypass path, said method further comprising:

selectively switching the second switch between connecting the isolated port of the second hybrid circuit to a terminating resistor and connecting the isolated port of the second hybrid circuit to the first switch.

11. The method for amplifying a signal of claim 9, wherein the driver signal is a radio-frequency analog signal.

12. A power amplifier circuit arrangement, comprising:
a driver amplifier for transmitting an analog signal;
a first switch for switching the analog signal between a bypass path and an amplifier path, said amplifier path comprising:
  a band pass filter which filters the analog signal to produce a filtered signal;
  a first hybrid circuit for splitting the filtered signal into an in-phase signal and a quadrature signal;
  a first power amplifier for amplifying the in-phase signal to produce a first amplified signal;
  a second power amplifier for amplifying the quadrature signal to produce a second amplified signal; and
  a second hybrid circuit for inverting the first amplified signal to produce an inverted signal and for summing the inverted signal and the second amplified signal,
said bypass path connecting an output of said driver amplifier and an isolated port of said second hybrid circuit when said first switch switches the analog signal to said bypass path.

13. The power amplifier circuit arrangement of claim 12, wherein the analog signal is a radio-frequency analog signal.

14. The power amplifier circuit arrangement of claim 12, wherein said switch switches to said bypass path when the power amplifier is turned off.

15. The circuit arrangement of claim 12 further comprising:
a second switch positioned in said bypass path; and
a terminating resistor connected to a pole of said second switch,
said second switch selectively connecting the isolated port of said second hybrid circuit with either said first switch or said terminating resistor.

16. The circuit arrangement of claim 12 further comprising:
a first shunt switch positioned between said first power amplifier and said second hybrid circuit; and
a second shunt switch positioned between said second power amplifier and said second hybrid circuit;
said first and second shunt switches being used to shunt the output of said first and second power amplifiers, respectively, when using said bypass path.

17. A power amplifier circuit arrangement, comprising:
a driver amplifier for transmitting an analog signal;
a first switch for switching the analog signal between a bypass path and an amplifier path, said amplifier path comprising:
  a band pass filter which filters the analog signal to produce a filtered signal;
  a first hybrid circuit for splitting the filtered signal into an in-phase signal and a quadrature signal;
  a first power amplifier for amplifying the in-phase signal to produce a first amplified signal;
  a second power amplifier for amplifying the quadrature signal to produce a second amplified signal; and
  a second hybrid circuit for inverting the second amplified signal to produce an inverted signal and for summing the inverted signal and the first amplified signal,
said bypass path connecting an output of said driver amplifier and an isolated port of said second hybrid circuit when said first switch switches the analog signal to said bypass path.

18. The power amplifier circuit arrangement of claim 17, wherein the analog signal is a radio-frequency analog signal.

19. The power amplifier circuit arrangement of claim 17, wherein said switch switches to said bypass path when the power amplifier is turned off.

20. The circuit arrangement of claim 17 further comprising:
a second switch positioned in said bypass path; and
a terminating resistor connected to a pole of said second switch,
said second switch selectively connecting the isolated port of said second hybrid circuit with either said first switch or said terminating resistor.

21. The circuit arrangement of claim 17 further comprising:
a first shunt switch positioned between said first power amplifier and said second hybrid circuit; and
a second shunt switch positioned between said second power amplifier and said second hybrid circuit;
said first and second shunt switches being used to shunt the output of said first and second power amplifiers, respectively, when using said bypass path.

22. A method for amplifying a signal in a circuit having a driver amplifier, an amplifier path comprising a first switch, a band-pass filter, a first power amplifier, a second power amplifier, a first hybrid circuit and a second hybrid circuit, and a bypass path connecting an isolated port of the second hybrid circuit with the first switch, said method comprising:

(A) producing a driver signal from the driver amplifier;
(B) selectively switching the driver signal between the amplifier path and the bypass path using the first switch,
wherein when the driver signal is switched in said switching step to the amplifier path, said method further comprises:
  (a) band-pass filtering the driver signal by the band-pass filter to produce a filtered signal;
  (b) splitting the filtered signal in the first hybrid circuit into an in-phase signal and a quadrature signal;
  (c) amplifying the in-phase signal by the first power amplifier to produce an amplified in-phase signal;
  (d) amplifying the quadrature signal by the second power amplifier to produce an amplified quadrature signal;
  (e) inverting the amplified in-phase signal in the second hybrid circuit to produce an inverted signal; and
  (f) summing the inverted signal and the amplified quadrature signal in the second hybrid circuit to produce a summed signal,
and wherein when the driver signal is switched in said switching step to the bypass path, said method further comprises:
  (a) turning off the first power amplifier and the second power amplifier;
  (b) transmitting the driver signal to the isolated port of the second hybrid circuit;

(c) splitting the driver signal into an in-phase signal and a quadrature signal in the second hybrid circuit;
(d) reflecting the in-phase signal off of the first amplifier signal;
(e) reflecting the quadrature signal off of the second power amplifier;
(f) inverting the reflected in-phase signal in the second hybrid circuit to produce an inverted signal;
(g) summing the inverted signal and the quadrature signal in the second hybrid circuit to produce a summed signal; and
(h) outputting the summed signal to an output port.

23. The method for amplifying a signal of claim 22 wherein the driver signal is a radio-frequency analog signal.

24. The method of claim 22 wherein the circuit further comprises a second switch positioned in the bypass path, said method further comprising:
selectively switching the second switch between connecting the isolated port of the second hybrid circuit to a terminating resistor and connecting the isolated port of the second hybrid circuit to the first switch.

25. A method for amplifying a signal in a circuit having a driver amplifier, an amplifier path comprising a first switch, a band-pass filter, a first power amplifier, a second power amplifier, a first hybrid circuit and a second hybrid circuit, and a bypass path connecting an isolated port of the second hybrid circuit with the first switch, said method comprising:
(A) producing a driver signal from the driver amplifier;
(B) selectively switching the driver signal between the amplifier path and the bypass path using the first switch,
wherein when the driver signal is switched in said switching step to the amplifier path, said method further comprises:
(a) band-pass filtering the driver signal by the band-pass filter to produce a filtered signal;
(b) splitting the filtered signal in the first hybrid circuit into an in-phase signal and a quadrature signal;
(c) amplifying the in-phase signal by the first power amplifier to produce an amplified in-phase signal;
(d) amplifying the quadrature signal by the second power amplifier to produce an amplified quadrature signal;
(e) inverting the amplified quadrature signal in the second hybrid circuit to produce an inverted signal; and
(f) summing the inverted signal and the amplified in-phase signal in the second hybrid circuit to produce a summed signal,
and wherein when the driver signal is switched in said switching step to the bypass path, said method further comprises:
(a) turning off the first power amplifier and the second power amplifier;
(b) transmitting the driver signal to the isolated port of the second hybrid circuit;
(c) splitting the driver signal into an in-phase signal and a quadrature signal in the second hybrid circuit;
(d) reflecting the in-phase signal off of the first amplifier signal;
(e) reflecting the quadrature signal off of the second power amplifier;
(f) inverting the reflected quadrature signal in the second hybrid circuit to produce an inverted signal;
(g) summing the inverted signal and the in-phase in the second hybrid circuit to produce a summed signal; and
(h) outputting the summed signal to an output port.

26. The method for amplifying a signal of claim 25 wherein the driver signal is a radio-frequency analog signal.

27. The method of claim 25 wherein the circuit further comprises a second switch positioned in the bypass path, said method further comprising:
selectively switching the second switch between connecting the isolated port of the second hybrid circuit to a terminating resistor and connecting the isolated port of the second hybrid circuit to the first switch.

28. A mobile communication unit having a power supply, a digital processor, a receiving chain, a transmitting chain, a duplexer, an antenna, and user interfacing means, said mobile communication unit comprising:
a power amplifier circuit arrangement in said transmitting chain, said power amplifier circuit comprising:
a driver amplifier for transmitting an analog signal;
a first switch for selectively switching the analog signal between a bypass path and an amplifier path, said amplifier path comprising:
a band-pass filter for filtering the analog signal and for producing a filtered signal;
a power amplifier for receiving the filtered signal and for producing an amplified signal;
a first hybrid circuit for splitting the amplified signal into an in-phase signal and a quadrature signal; and
a second hybrid circuit for inverting the in-phase signal to produce an inverted signal and for summing the inverted signal and the quadrature signal to produce a summed signal,
said bypass path connecting an output of said driver amplifier with an isolated port of said second hybrid circuit when said first switch switches the analog signal to said bypass path, whereby the analog signal transmitted from said driver amplifier will reflect off of said power amplifier and be routed to an output port.

29. The mobile communication unit of claim 28, wherein said power amplifier circuit arrangement further comprises:
a second switch positioned in said bypass path; and
a terminating resistor connected to a pole of said second switch,
said second switch selectively connecting the isolated port of said second hybrid circuit with either said first switch or said terminating resistor.

30. The mobile communication unit of claim 28, wherein said first switch switches the analog signal to said bypass path when said power amplifier is turned off.

31. A mobile communication unit having a power supply, a digital processor, a receiving chain, a transmitting chain, a duplexer, an antenna, and user interfacing means, said mobile communication unit comprising:
a power amplifier circuit arrangement in said transmitting chain, said power amplifier circuit arrangement comprising:
a driver amplifier for transmitting an analog signal;
a first switch for switching the analog signal between a bypass path and an amplifier path, said amplifier path comprising:
a band pass filter which filters the analog signal to produce a filtered signal;
a first hybrid circuit for splitting the filtered signal into an in-phase signal and a quadrature signal;
a first power amplifier for amplifying the in-phase signal to produce a first amplified signal;
a second power amplifier for amplifying the quadrature signal to produce a second amplified signal; and a second hybrid circuit for inverting the first amplified signal to produce an inverted signal and for summing the inverted signal and the second amplified signal, said bypass path connecting an output of said driver amplifier and an isolated port of said second hybrid circuit when said first switch switches the analog signal to said bypass path.

32. The mobile communication unit of claim 31, wherein said power amplifier circuit arrangement further comprises:
   a second switch positioned in said bypass path; and
   a terminating resistor connected to a pole of said second switch;
   said second switch selectively connecting the isolated port of said second hybrid circuit with either said first switch or said terminating resistor.

33. The mobile communication unit of claim 31, wherein said power amplifier circuit arrangement further comprises:
   a first shunt switch positioned between said first power amplifier and said second hybrid; and
   a second shunt switch positioned between said second power amplifier and said second hybrid circuit;
   said first and second shunt switches being used to shunt the output of said first and second power amplifiers, respectively, when using said bypass path.

* * * * *